(12) United States Patent
Sakurai (10) Patent No.: US 9,467,128 B2
(45) Date of Patent: Oct. 11, 2016

(54) LINEARIZATION CIRCUIT FOR HIGH FREQUENCY SIGNAL PHASE ADJUSTMENT

(71) Applicant: TEXAS INSTRUMENTS INCORPORATED, Dallas, TX (US)

(72) Inventor: Satoshi Sakurai, San Carlos, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 75 days.

(21) Appl. No.: 14/228,495

(22) Filed: Mar. 28, 2014

(65) Prior Publication Data

US 2015/0280699 A1    Oct. 1, 2015

(51) Int. Cl.
*H03K 5/13* (2014.01)
*H03K 17/687* (2006.01)

(52) U.S. Cl.
CPC ............... *H03K 5/13* (2013.01); *H03K 17/687* (2013.01)

(58) Field of Classification Search
USPC .......................................................... 327/237
See application file for complete search history.

(56) References Cited

U.S. PATENT DOCUMENTS

| | | | | |
|---|---|---|---|---|
| 7,230,503 B1 * | 6/2007 | Huang | ...................... | H03J 3/20 331/117 R |
| 2003/0193371 A1 | 10/2003 | Larson et al. | | |
| 2012/0229174 A1 * | 9/2012 | Shiah | ............... | H03K 19/09482 327/109 |
| 2013/0207827 A1 * | 8/2013 | Nestler | ................... | H03H 15/02 341/172 |

FOREIGN PATENT DOCUMENTS

| WO | WO2007006868 A1 | 1/2007 |
|---|---|---|
| WO | WO2009066211 A2 | 5/2009 |

OTHER PUBLICATIONS

Sedra et al., pp. 236-237 of Microelectronic Circuits, 2004, fifth edition, Oxford University Press.*
PCT Search Report Application No. PCT/US 2015/023382, dated Aug. 27, 2015.

* cited by examiner

*Primary Examiner* — Lincoln Donovan
*Assistant Examiner* — Patrick Chen
(74) *Attorney, Agent, or Firm* — Andrew Viger; Frank D. Cimino (57) ABSTRACT

A circuit includes a phase adjustment capacitor (PAC) coupled to a signal path and configured to adjust a phase of a signal on the signal path. A transistor switch device is coupled in series with the PAC to provide a circuit branch parallel with the signal path. The transistor switch device is configured to selectively open or close the circuit branch of the signal path to enable or disable, respectively, the adjustment of the phase of the signal on the signal path via the PAC. A nonlinear capacitance is coupled to a node interconnecting the PAC and the transistor switch device. The nonlinear capacitance is configured to vary inversely proportional with a capacitance of the transistor switch device with respect to the signal on the signal path and to linearize a total capacitance provided by the circuit branch when the circuit branch is open.

18 Claims, 5 Drawing Sheets

LINEARIZATION CIRCUIT FOR HIGH FREQUENCY SIGNAL PHASE ADJUSTMENT

TECHNICAL FIELD

This disclosure relates to analog signal processing, and more particularly to a linearization circuit that compensates for nonlinearity of a phase adjustment circuit.

BACKGROUND

In certain analog signal processing applications, capacitors are added to a signal path to adjust the phase of the signal. This may be performed to match the phase of the signal relative to another signal, or it may be performed to tune the filter characteristics, for example. One of the simplest and the most straight-forward techniques to control the capacitance to be adjusted is by connecting a metal oxide semiconductor (MOS) switch in series with the capacitor. Thus, circuitry can turn on the switch to add capacitance to a given signal processing circuit, and turn off the switch to not add the capacitance.

Generally, the switch size is selected large enough such that the on-resistance of the switch is small. For a signal frequency that is 100 MHz or less, for example, selecting a very large switch has little side effect to the signal linearity. However, when the signal frequency goes into several hundred MHz, for example, using a large switch can have a negative effect on the signal linearity when the switch is turned off.

SUMMARY

This disclosure relates to a linearization circuit that compensates for nonlinearity in a switched capacitive branch of a phase adjustment circuit.

In one example, a circuit includes a phase adjustment capacitor (PAC) coupled to a signal path and configured to adjust a phase of a signal on the signal path. A transistor switch device is coupled in series with the PAC to provide a circuit branch parallel with the signal path. The transistor switch device is configured to selectively open or close the circuit branch of the signal path to enable or disable, respectively, the adjustment of the phase of the signal on the signal path via the PAC. A nonlinear capacitance is coupled to a node interconnecting the PAC and the transistor switch device. The nonlinear capacitance is configured to vary inversely proportional with a capacitance of the transistor switch device with respect to the signal on the signal path and to linearize a total capacitance provided by the circuit branch when the circuit branch is open.

In another example, a circuit includes a phase adjustment capacitor (PAC) coupled to a signal path and configured to adjust a phase of a signal on the signal path. A transistor switch device is coupled in series with the PAC to provide a circuit branch parallel with the signal path. The transistor switch device is configured to selectively open or close the circuit branch of the signal path to enable or disable, respectively, the adjustment of the signal phase of the signal path via the PAC. A compensation semiconductor device includes at least one junction having a nonlinear capacitance. The compensation semiconductor device is coupled to a node interconnecting the PAC and the transistor switch device. The nonlinear capacitance of the compensation semiconductor device is configured to vary inversely proportional with a capacitance of the transistor switch device with respect to the signal on the signal path and to linearize a total capacitance provided by the circuit branch when the circuit branch is open.

In yet another example, a circuit includes a phase adjustment capacitor (PAC) coupled to a signal path and configured to adjust a phase of a signal on the signal path. A transistor switch device is coupled in series with the PAC to provide a circuit branch parallel with the signal path. The transistor switch device is configured to selectively open or close the circuit branch of the signal path to enable or disable, respectively, the adjustment of the signal phase of the signal path via the PAC. A compensation transistor device having a source, a drain, and a gate is coupled to a node interconnecting the PAC and the transistor switch device. The compensation transistor device is configured to provide a nonlinear capacitance formed between either the source or the drain with respect to a substrate of the compensation transistor device. The nonlinear capacitance varies inversely proportional with a capacitance of the transistor switch device with respect to the signal on the signal path and linearizes a total capacitance provided by the circuit branch when the circuit branch is open. A tuning voltage is applied to the gate of the compensation transistor device to adjust the nonlinear capacitance of the compensation transistor device based on the tuning voltage.

DETAILED DESCRIPTION

This disclosure relates to a linearization circuit that compensates for nonlinearity in a switched capacitive branch of a phase adjustment circuit. The phase adjustment circuit includes a phase adjustment capacitor (PAC) that is coupled to a signal path and employed to adjust a signal phase of the signal path. The PAC may be selectively coupled to or decoupled from the signal path depending on whether or not signal phase adjustment is desired for the signal path. A transistor switch device can be coupled in series with the PAC to provide a parallel circuit branch connection with the signal path. The transistor switch device can selectively open or close the circuit branch of the signal path to enable or disable the adjustment of the signal phase of the signal path by enabling or disabling the circuit connection to the PAC. The transistor switch device can be factory-set and/or set (e.g., on or off) in an application environment depending on the signal phase adjustment needs of the respective application.

A nonlinear capacitance can be coupled to a node interconnecting the PAC and the transistor switch device. The nonlinear capacitance is employed to compensate for nonlinearities that may appear on the signal path as signal path input frequencies increase and when the transistor switch device is disabled. The respective nonlinearities can be caused by a junction capacitance of the transistor switch device when disabled. Thus, as input voltages are varied, the voltage across the transistor switch device when set to off can vary which in turn can cause the junction capacitance to vary. In order to counteract the effects of the off-state junction capacitance of the transistor switch device, the nonlinear capacitance varies its respective capacitance inversely proportional with the capacitance of the transistor switch device when disabled. This linearizes the total capacitance provided by the circuit branch when the circuit branch is opened via the transistor switch device and thus mitigates nonlinearities on the signal path.

Figure 1:
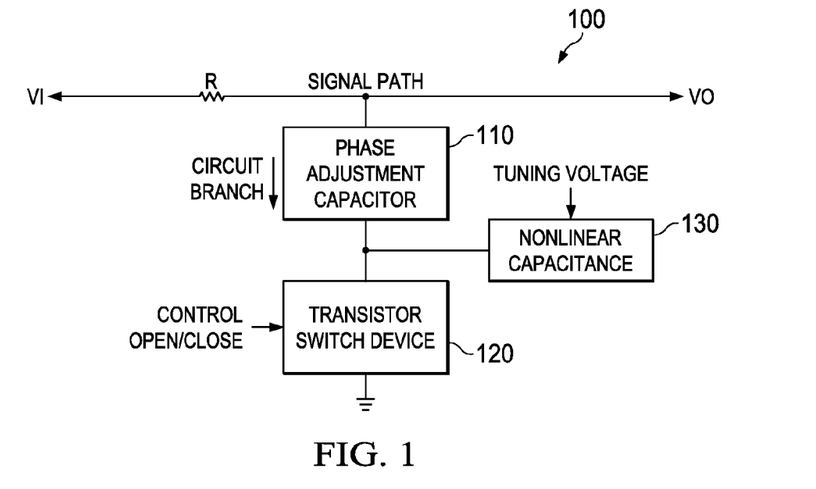
FIG. 1 illustrates an example circuit configured to compensate for nonlinearity in a phase adjustment circuit.

FIG. 1 illustrates an example of circuit 100 that compensates for nonlinearity in a phase adjustment circuit. As used herein, the term circuit can include a collection of active and/or passive elements that perform a circuit function such as a transistor or capacitor. The term circuit can also include an integrated circuit where all the circuit elements are fabricated on a common substrate, for example. As shown in FIG. 1, the circuit 100 includes a signal path where input voltage frequencies are applied as voltage input (VI) and output frequencies are supplied as voltage output (VO). A typical signal path component is shown as resistor (R) but other path components (e.g., inductors, capacitors, semiconductors) including parallel and/or serial combinations are possible.

The circuit 100 includes a phase adjustment capacitor (PAC) 110 that is coupled to the signal path and employed to adjust a signal phase of the signal path. The PAC 110 can be selectively coupled to or decoupled from the signal path depending on whether or not signal phase adjustment is desired for the signal path. A transistor switch device 120 can be coupled in series with the PAC 110 to provide a parallel circuit branch connection with the signal path. The transistor switch device 120 (e.g., NMOS or PMOS field effect transistor) can selectively open or close the circuit branch of the signal path to enable or disable the adjustment of the signal phase of the signal path by enabling or disabling the circuit connection to the PAC 110. As shown, a control input (e.g., gate input) can be employed to open or close the transistor switch device 120. The control input for the transistor switch device 120 can be factory-set and/or set (e.g., high or low) in an application environment depending on the signal phase adjustment needs of the respective application.

A nonlinear capacitance 130 can be coupled to a node interconnecting the PAC 110 and the transistor switch device 120. The nonlinear capacitance 110 can be employed to compensate for nonlinearities (e.g., second harmonic distortions) that may appear on the signal path as signal path input voltages VI increase and when the transistor switch device 120 is disabled (e.g., control input set to ground). The respective nonlinearities can be caused by a junction capacitance of the transistor switch device 120 when disabled. As input voltages VI applied to the signal path are varied, the voltage across the transistor switch device 120 when set to off can also vary, which in turn can cause the junction capacitance to vary. In order to counteract the effects of the off-state junction capacitance of the transistor switch device 120, the nonlinear capacitance 130 varies its respective capacitance inversely proportional with the capacitance of the transistor switch device when the circuit branch is open. This linearizes the total capacitance provided by the circuit branch when the circuit branch is opened via the transistor switch device 120 and thus mitigates nonlinearities on the signal path.

As will be illustrated and described below with respect to FIGS. 2-9, various configurations for the circuit 100 are possible. In one example, the nonlinear capacitance 130 can be configured as a compensation diode having a junction capacitance that varies inversely to the junction capacitance of the transistor switch device 120. In another example, the nonlinear capacitance 130 can be configured as a compensation diode having a junction capacitance that is formed from a compensation transistor. The source or the drain (or both) of the compensation transistor can form the compensation diode with respect to a substrate of the compensation transistor, for example. A tuning voltage can be applied to the nonlinear capacitance 130 to adjust its capacitance over a range depending on the voltage setting of the tuning voltage. Other parameters can also be controlled to adjust the nonlinear capacitance as will be described below.

Figure 2:
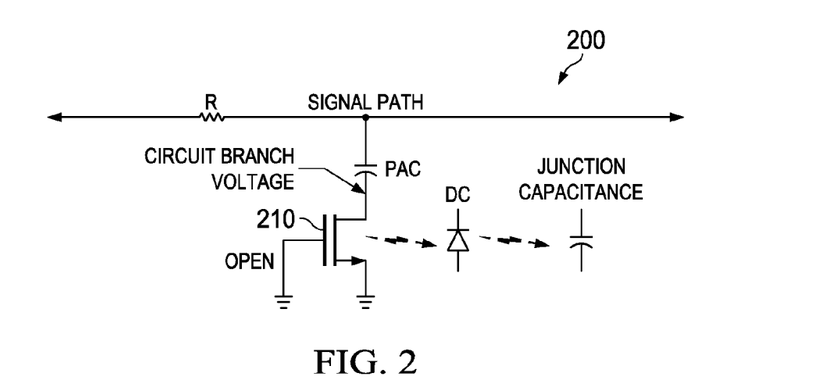
FIG. 2 illustrates an example phase adjustment circuit having a circuit branch that is opened via a transistor switch device.

FIG. 2 illustrates an example phase adjustment circuit 200 having a circuit branch that is opened via a transistor switch device 210. In this example, a resistor R is connected in series with a signal path. A circuit branch is formed via phase adjustment capacitor (PAC). Signal path voltage is coupled through capacitor PAC and supplied to a connecting node of the transistor switch device 210 as a circuit branch voltage. In this example, a gate of the transistor switch device 210 is at ground potential, which disables the transistor switch device and thus opens the circuit branch. By opening the circuit branch, the capacitor PAC cannot affect the phase of the voltage on the signal path. However, when the transistor switch device 210 is disabled, and as voltages are increased along the signal path, signal path nonlinearities can be introduced due to the disabled transistor switch device 210.

As shown, when disabled, the transistor switch device 210 when disabled can be modeled as a circuit branch diode (DC) that is reversed biased with respect to the signal path. The diode DC in turn is associated with a junction capacitance (between source or drain with respect to substrate) that is a function of the circuit branch voltage. Thus, as signal path voltages increase, the circuit branch voltage can increase which causes a decrease of the junction capacitance of the diode DC which further increases nonlinearities such as second harmonic distortions to appear on the signal path. The circuits depicted in FIGS. 3-7 illustrate examples of how a nonlinear capacitance can be employed to counteract the junction capacitance of the transistor switch device 210 when switched off.

Figure 3:
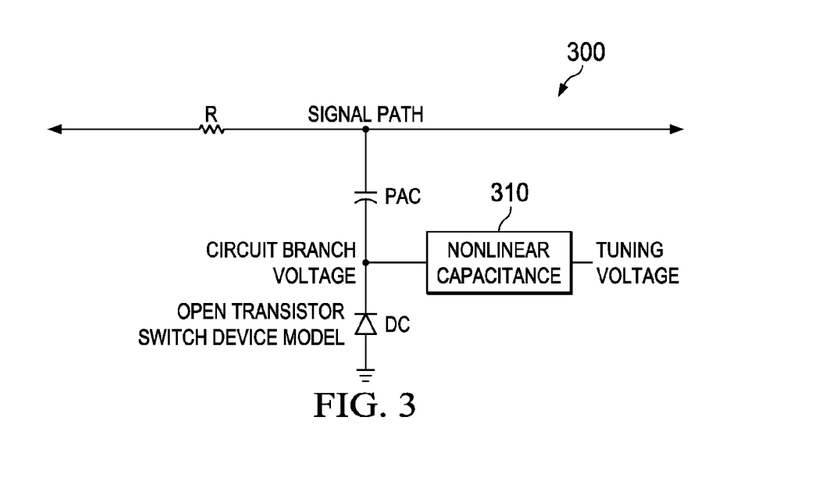
FIG. 3 illustrates an example phase adjustment circuit having nonlinear capacitance compensation when the circuit branch is opened.

FIG. 3 illustrates an example phase adjustment circuit 300 having nonlinear capacitance compensation when the circuit branch is opened. In this example, diode DC is shown in the circuit branch to represent the open transistor switch device depicted in FIG. 2. As noted above, as signal path voltages increase, a corresponding increase in circuit branch voltage nonlinearity can occur due to changes in the junction capacitance of diode DC. In order to counteract such effects, a nonlinear capacitance 310 can be coupled to a node interconnecting the PAC and the transistor switch device which in this example is represented as diode DC.

The nonlinear capacitance 310 can be configured to vary inversely proportional with the transistor switch device represented by diode DC. As such, this nonlinear capacitance operates to linearize a total capacitance provided by the circuit branch when the circuit branch is open. Thus, when the circuit branch voltage increases, the voltage across the nonlinear capacitance decreases. The decreasing voltage causes the capacitance of the nonlinear capacitance to in turn increase which mitigates capacitance decreases on diode DC which represents the open transistor switch device. In some examples, a DC tuning voltage can be applied to the nonlinear capacitance 310 to adjust the capacitance of the nonlinear capacitance as disclosed herein. The circuits depicted in FIGS. 4-7 illustrate example configurations for the nonlinear capacitance 310.

Figure 4:
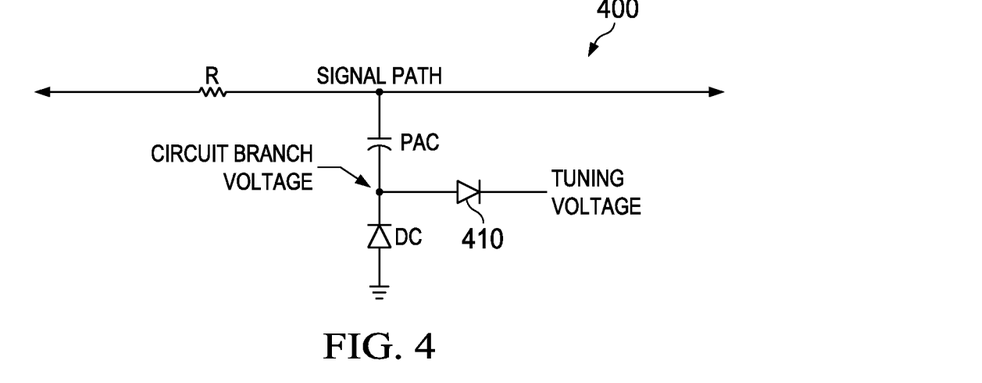
FIG. 4 illustrates an example phase adjustment circuit that employs a compensation diode providing nonlinear capacitance compensation when the circuit branch is opened.

FIG. 4 illustrates an example phase adjustment circuit 400 that employs a compensation diode providing nonlinear capacitance compensation when the circuit branch is opened. In this example, a nonlinear capacitance is configured as a compensation diode 410 and is coupled in parallel with a junction diode DC formed between the interconnecting node to the PAC and a substrate of the transistor switch device when the circuit branch is open. A tuning voltage can be applied to the compensation diode 410 to adjust the nonlinear capacitance of the compensation diode. In this example, if the circuit branch voltage increases with a corresponding decrease in junction capacitance of diode DC, the voltage across the compensation diode 410 increases since it is referenced to the tuning voltage.

Figure 5:
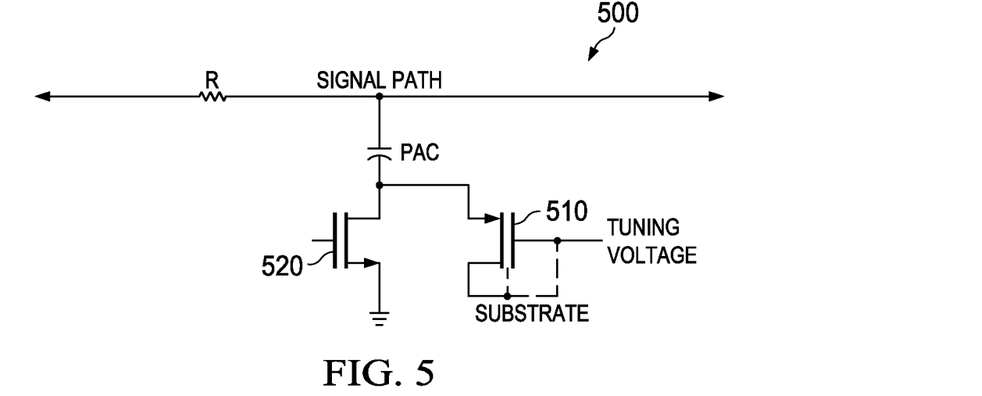
FIG. 5 illustrates an example phase adjustment circuit that employs a compensation transistor providing nonlinear capacitance compensation when the circuit branch is opened.
Figure 6:
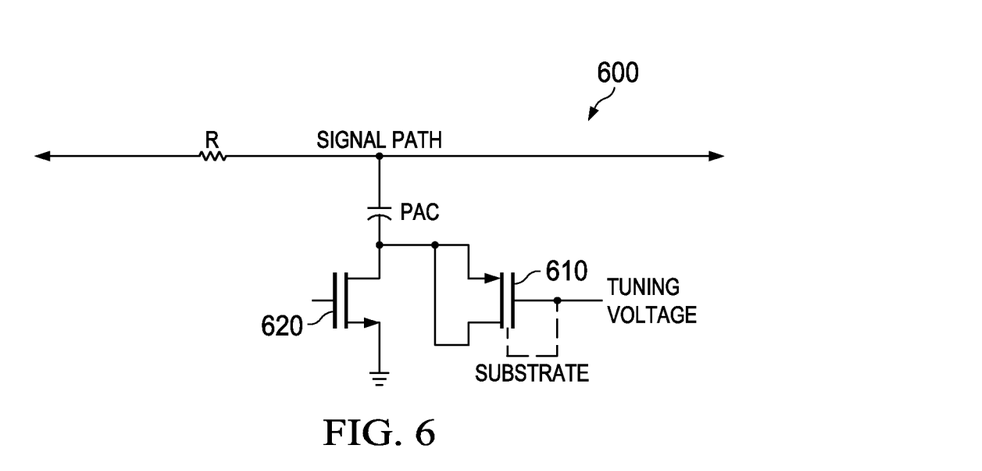
FIG. 6 illustrates an example phase adjustment circuit that employs a compensation transistor having a common connection for source and drain and providing nonlinear capacitance compensation when the circuit branch is opened.
Figure 7:
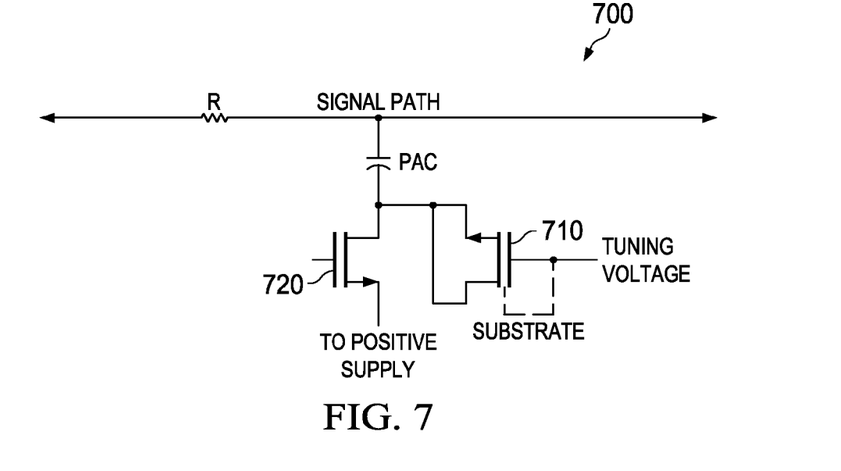
FIG. 7 illustrates an alternative example phase adjustment circuit that employs a compensation transistor having a common connection for source and drain and providing nonlinear capacitance compensation when the circuit branch is opened.

FIGS. 5-7 illustrate alternative nonlinear capacitance configurations where the compensation diode 410 is configured from a compensation transistor.

FIG. 5 illustrates an example phase adjustment circuit 500 that employs a compensation transistor device 510 providing nonlinear capacitance compensation when the circuit branch is opened via transistor switch device 520. The compensation diode described above with respect to FIG. 4 can be configured from the compensation transistor device 510 having a source, a drain, and a gate. The compensation diode can be formed between either the source or the drain with respect to a substrate of the compensation transistor device 510. In the example depicted in FIG. 5, the compensation diode is formed between the source and the substrate of the compensation transistor device 510 while the drain is tied to the substrate. A tuning voltage can be applied (e.g., by control circuitry—not shown) to adjust the capacitance of the diode formed by the compensation transistor 510. A dotted line represents a substrate connection for the compensation transistor device 510 and can be coupled to the tuning voltage, for example, as shown.

FIG. 6 illustrates an example phase adjustment circuit 600 that employs a compensation transistor device 610 configured with a common connection for source and drain and providing nonlinear capacitance compensation when the circuit branch is opened via transistor switch device 620. As shown in the example of FIG. 6, each of the source and the drain of the compensation transistor device 610 are coupled together to form the compensation diode with respect to the substrate of the compensation transistor device. Coupling the source and drain together in this manner increases (e.g., doubles) the nonlinear capacitance of the compensation diode configured from the compensation transistor device 610. A tuning voltage can be applied (e.g., by control circuitry—not shown) to the gate of compensation transistor device 610 to adjust the nonlinear capacitance of the compensation diode configured from the compensation transistor device. For example, the tuning voltage applied to the gate can be in a range of about 1.5 volts to about 2.0 volts to adjust the nonlinear capacitance of the compensation diode configured from the compensation transistor device 610. A dotted line represents a substrate connection for the compensation transistor device 610 and can be coupled to the tuning voltage, for example.

FIG. 7 illustrates an alternative example phase adjustment circuit 700 that employs a compensation transistor device 710 having a common connection for source and drain and providing nonlinear capacitance compensation when the circuit branch is opened via transistor switch device 720. In this example, the transistor switch device 720 and the compensation transistor device 710 are configured as complimentary devices from the examples shown in FIGS. 5 and 6. With respect to the examples of FIGS. 5 and 6, if the transistor switch device is configured as an NMOS device, then the compensation transistor device is configured as a PMOS device. With respect to the example of FIG. 7, if the transistor switch device 720 is configured as a PMOS device, then the compensation transistor device 710 is configured as an NMOS device. A dotted line represents a substrate connection for the compensation transistor device 710 and can be coupled to the tuning voltage, for example. As shown, when a PMOS device is employed as the transistor switch device 720, the source of the transistor switch device is coupled to a positive supply voltage such as VDD, for example.

Figure 8:
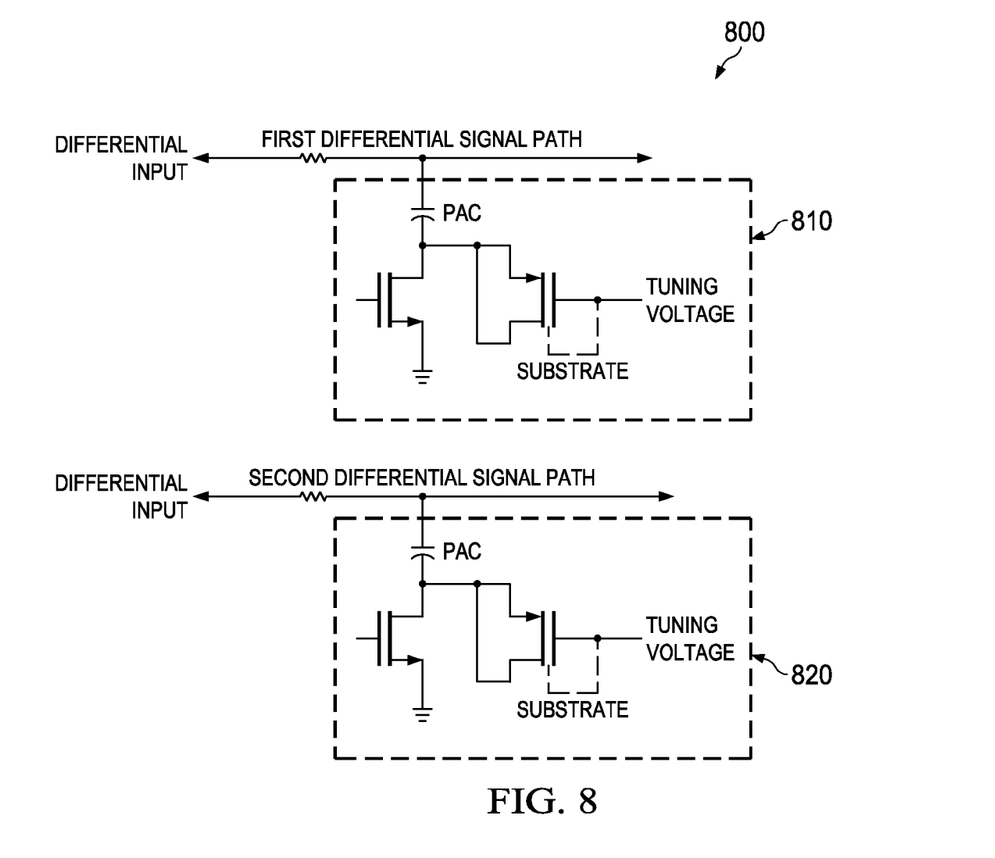
FIG. 8 illustrates a differential signal path where phase adjustment circuits having nonlinear capacitance compensation are applied each path of the differential signal path.

FIG. 8 illustrates a differential signal path circuit 800 where phase adjustment circuits having nonlinear capacitance compensation are applied each path of the differential signal path. In this example, a first PAC, transistor switch device, and nonlinear capacitance form a first phase adjuster 810 in a first differential signal path. A second PAC, a second transistor device, and a second nonlinear capacitance form a second phase adjuster 820 in a second differential signal path to enable differential phase adjustment of a differential signal applied to the first and second differential signal paths.

Figure 9:
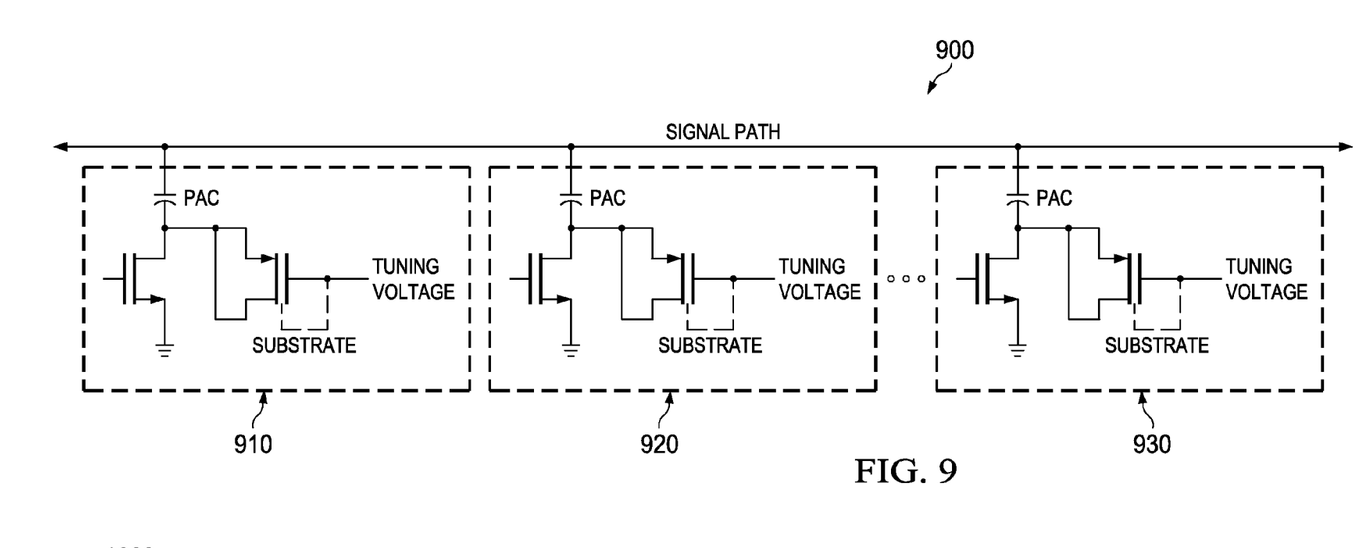
FIG. 9 illustrates a signal path where multiple phase adjustment circuits having nonlinear capacitance compensation are applied across the signal path.

FIG. 9 illustrates a signal path 900 where multiple phase adjustment circuits having nonlinear capacitance compensation are applied across the signal path. In this example, a first PAC, transistor switch device, and nonlinear capacitance form a first phase adjuster 910 for the signal path. A second PAC, a second transistor device, and a second nonlinear capacitance form a second phase adjuster 920. An Nth phase adjuster 930 can also be utilized in the signal path to enable multiple phase adjustments along the signal path, wherein N is a positive integer.

Figure 10:
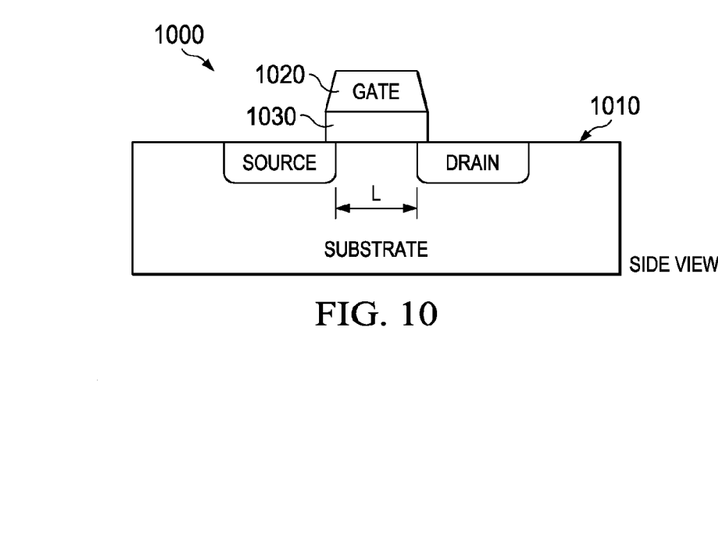
FIG. 10 illustrates a side-view of a metal oxide semiconductor transistor depicting a length parameter between source and drain wells in a semiconductor substrate.

FIG. 10 illustrates a side-view of a metal oxide semiconductor transistor 1000 depicting a length parameter (L) between source and drain wells in a semiconductor substrate 1010. A gate 1020 separated by an oxide layer 1030 controls the channel formed between the source and drain. In one particular example for the parameter L, the length L for both transistor switch device and the compensation transistor switch device can be about 0.13 micrometers, however other dimensions are possible.

Figure 11:
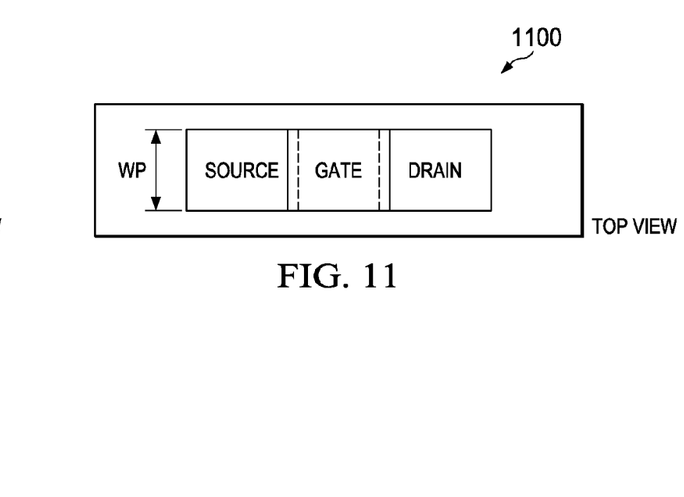
FIG. 11 illustrates a top-view of a metal oxide semiconductor transistor depicting a width parameter for the transistor.

FIG. 11 illustrates a top-view of a metal oxide semiconductor transistor 1100 depicting a width parameter (WP) for the transistor. With respect to the circuit examples describe above with respect to FIGS. 5-9, the transistor switch device 1100 can be configured with a first width parameter and the compensation transistor device can be configured with a second width parameter that is less than the first width parameter. For example, the first width parameter (1 WP) and the second width parameter (2 WP) form a ratio of 1 WP/2 WP, wherein the ratio of 1 WP/2 WP is in a range of about 5 to about 2; however, other ranges are possible. In one example, the first width parameter can be about 40 micrometers and the second width parameter can be in a range of about 8 micrometers to about 16 micrometers however other ranges of width parameters are possible.

Figure 12:
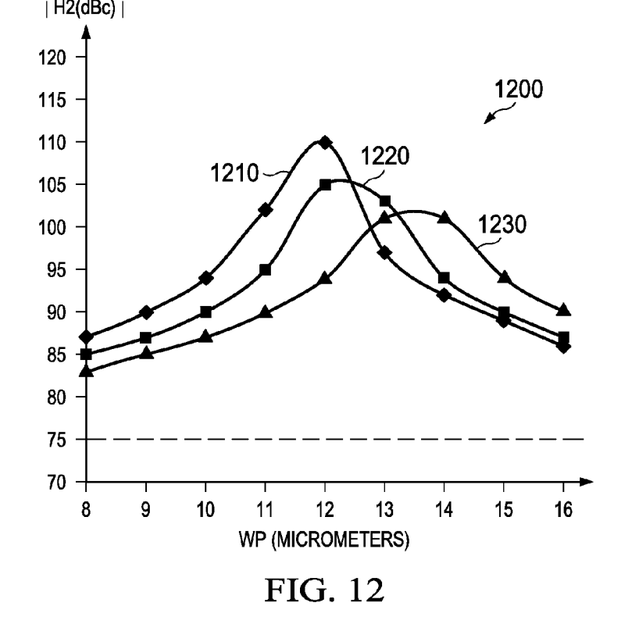
FIG. 12 illustrates a signal diagram depicting the effects of a width parameter of a nonlinear capacitance compensation transistor with respect to mitigation of signal path nonlinearities.

FIG. 12 illustrates a signal diagram 1200 depicting the effects of a width parameter of a nonlinear capacitance compensation transistor with respect to mitigation of signal path nonlinearities. In this example, signal nonlinearity is depicted on the vertical axis of diagram 1200 as |H2(dBc)|, wherein H2 is second harmonic distortion and dBc is decibels relative to a carrier. The horizontal axis of diagram 1200 represents a width parameter (WP) for the compensation transistor device described above which ranges from about 8 micrometers to about 16 micrometers. Three signal plots 1210, 1220, and, 1230 are shown which were plotted at temperatures −40 C, +40, and +127 C, respectively. Peak nonlinear compensation performance occurs when the width parameter WP is between about 11 micrometers and 14 micrometers and depending on the respective temperature. The corresponding width parameter for the transistor switch device when plotting the signal diagram 1200 was held at about 40 micrometers.

Figure 13:
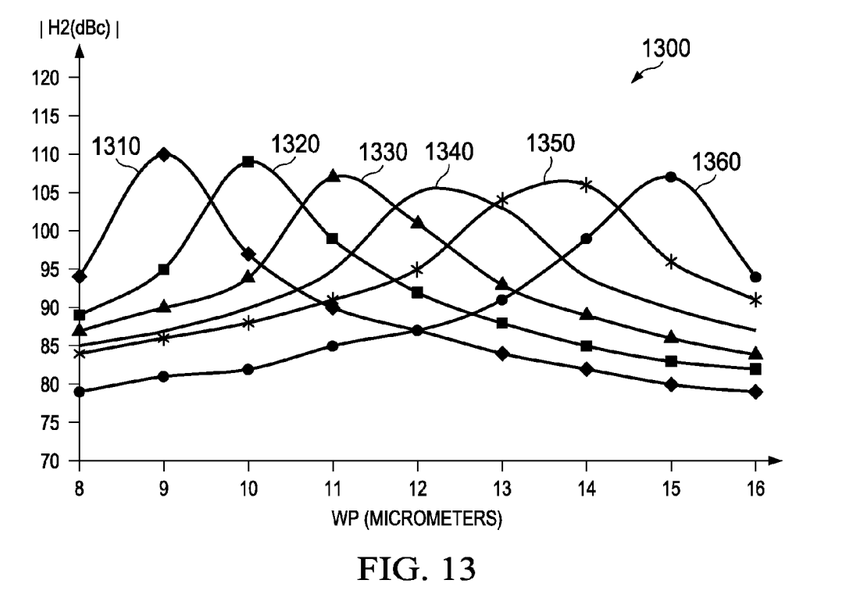
FIG. 13 illustrates a signal diagram depicting the effects of a tuning voltage of a nonlinear capacitance compensation transistor with respect to mitigation of signal path nonlinearities.

FIG. 13 illustrates a signal diagram 1300 depicting the effects of a tuning voltage of a nonlinear capacitance compensation transistor with respect to mitigation of signal path nonlinearities. In this example, tuning voltages were set from 1.5 volts to 2.0 volts with a given signal plot for each 0.1 v. Thus, signal plot 1310 is for 1.5 volts, signal plot 1320 is for 1.6 volts, signal plot 1330 is for 1.7 volts, signal plot 1340 is for 1.8 volts, signal plot 1350 is for 1.9 volts, and signal plot 1360 is for 2.0 volts, respectively.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
    a phase adjustment capacitor (PAC) coupled to a signal path and to adjust a phase of a signal on the signal path;
    a transistor switch device coupled in series with the PAC to provide a circuit branch parallel with the signal path, and to enable or disable, respectively, the adjustment of the phase of the signal on the signal path via the PAC,
    a compensation diode device coupled to a node interconnecting the PAC and the transistor switch device,
        the compensation diode device to provide an adjusted nonlinear capacitance based on a tuning voltage applied to the compensation diode device,
    the compensation diode device responsive to the tuning voltage to adjust a nonlinear capacitance to vary inversely proportional with a capacitance of the transistor switch device with respect to the signal on the signal path and to linearize a total capacitance provided by the circuit branch when the circuit branch is open.

2. The circuit of claim 1, wherein the compensation diode device is coupled in parallel with a junction diode formed between the interconnecting node and a substrate of the transistor switch device when the circuit branch is open.

3. The circuit of claim 1, wherein the compensation diode device comprises a compensation transistor device to provide the nonlinear capacitance, the compensation transistor device having a source, a drain, and a gate, the nonlinear capacitance formed between either the source or the drain and a substrate of the compensation transistor device, and the tuning voltage is applied to the gate and substrate of the compensation transistor device to adjust the nonlinear capacitance based on the tuning voltage that is applied.

4. The circuit of claim 3, wherein one of the source or the drain of the compensation transistor device is coupled to the node interconnecting the PAC and the transistor switch device to provide the nonlinear capacitance with respect to the substrate of the compensation transistor device and the other of the source or the drain is coupled to the substrate of the compensation transistor device.

5. The circuit of claim 3, wherein each of the source and the drain of the compensation transistor device are coupled together to provide the nonlinear capacitance with respect to the substrate of the compensation transistor device and to increase the nonlinear capacitance of the compensation transistor device.

6. The circuit of claim 3, wherein the tuning voltage applied to the gate is in a range of about 1.5 volts to about 2.0 volts to adjust the nonlinear capacitance.

7. The circuit of claim 3, wherein the transistor switch device has a first width parameter and the compensation transistor device has a second width parameter that is less than the first width parameter.

8. The circuit of claim 7, wherein the first width parameter (1WP) and the second width parameter (2WP) form a ratio of 1WP/2WP, wherein the ratio of 1WP/2WP is in a range of about 5 to about 2.

9. The circuit of claim 3, wherein the transistor switch device and the compensation transistor device are complimentary devices such that if the transistor switch device is an NMOS device, then the compensation transistor device is a PMOS device or if the transistor switch device is configured as a PMOS device, then the compensation transistor device is an NMOS device.

10. The circuit of claim 3, wherein the PAC, the transistor switch device, and the compensation transistor form a first phase adjuster in a first differential signal path, the circuit further comprising a second PAC, a second transistor device, and a second compensation transistor device to form a second phase adjuster in a second differential signal path, the first and second differential signal paths to enable differential phase adjustment of a differential signal applied to the first and second differential signal paths.

11. The circuit of claim 3, wherein the PAC, the transistor switch device, and the compensation transistor form a first phase adjuster for the signal path, the circuit further comprising a second PAC, a second transistor device, and a second compensation transistor device to form a second phase adjuster in the signal path, the first and second phase adjusters to enable multiple phase adjustments along the signal path.

12. A circuit comprising:
a phase adjustment capacitor (PAC) coupled to a signal path to adjust a phase of a signal on the signal path;
a transistor switch device coupled in series with the PAC to provide a circuit branch parallel with the signal path, the transistor switch device to selectively open or close the circuit branch of the signal path to enable or disable, respectively, the adjustment of the signal phase of the signal path via the PAC; and
a compensation semiconductor device configured as a diode that includes at least one junction having a nonlinear capacitance, the compensation semiconductor device being coupled to a node interconnecting the PAC and the transistor switch device, the nonlinear capacitance of the compensation semiconductor device adjustable based on a tuning voltage applied to the compensation semiconductor device to vary the nonlinear capacitance inversely proportional with a capacitance of the transistor switch device with respect to the signal on the signal path and to linearize a total capacitance provided by the circuit branch when the circuit branch is open.

13. The circuit of claim 12, wherein the compensation semiconductor device is configured from a compensation transistor device having a source, a drain, and a gate, the compensation semiconductor device formed between either the source or the drain with respect to a substrate of the compensation transistor device.

14. The circuit of claim 13, wherein the tuning voltage is applied to the gate and substrate of the compensation transistor device to adjust the nonlinear capacitance provided by the compensation transistor device based on the tuning voltage.

15. The circuit of claim 13, wherein the transistor switch device has a first width parameter (1WP) and the compensation transistor device has a second width parameter (2WP) and form a ratio of 1WP/2WP, wherein the ratio of 1WP/2WP is in a range of about 5 to about 2.

16. A circuit comprising:
a phase adjustment capacitor (PAC) coupled to a signal path to adjust a phase of a signal on the signal path;
a transistor switch device coupled in series with the PAC to provide a circuit branch parallel with the signal path, and to selectively open or close the circuit branch of the signal path to enable or disable, respectively, the adjustment of the signal phase of the signal path via the PAC; and
a compensation transistor device configured as a diode having a source, a drain, and a gate, the compensation transistor device coupled to a node interconnecting the PAC and the transistor switch device, to provide a nonlinear capacitance formed between either the source or the drain with respect to a substrate of the compensation transistor device, the nonlinear capacitance varying inversely proportional with a capacitance of the transistor switch device with respect to the signal on the signal path and to linearize a total capacitance provided by the circuit branch when the circuit branch is open, a tuning voltage being applied to the gate and substrate of the compensation transistor device to adjust the nonlinear capacitance of the compensation transistor device based on the tuning voltage.

17. The circuit of claim 16, wherein the transistor switch has a first width parameter (1WP) and the compensation transistor device has a second width parameter (2WP) and form a ratio of 1WP/2WP, wherein the ratio of 1WP/2WP is in a range of about 5 to about 2.

18. The circuit of claim 16, wherein the transistor switch device and the compensation transistor device are complimentary devices such that if the transistor switch device is an NMOS device, then the compensation transistor device is a PMOS device or if the transistor switch device is a PMOS device, then the compensation transistor device is an NMOS device.

* * * * *